United States Patent
Hu et al.

(10) Patent No.: US 12,270,851 B2
(45) Date of Patent: Apr. 8, 2025

(54) SWITCH SHORT-CIRCUITED DIAGNOSIS METHOD

(71) Applicant: DELTA ELECTRONICS, INC., Taoyuan (TW)

(72) Inventors: Kai-Wei Hu, Taoyuan (TW); Ping-Heng Wu, Taoyuan (TW); Lei-Chung Hsing, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 198 days.

(21) Appl. No.: 18/151,701

(22) Filed: Jan. 9, 2023

(65) Prior Publication Data
US 2024/0069090 A1 Feb. 29, 2024

(30) Foreign Application Priority Data

Aug. 26, 2022 (CN) .......................... 202211037092.1

(51) Int. Cl.
| | |
|---|---|
| *G01R 31/26* | (2020.01) |
| *G01R 31/52* | (2020.01) |
| *H02M 5/458* | (2006.01) |

(52) U.S. Cl.
CPC ......... *G01R 31/2617* (2013.01); *G01R 31/52* (2020.01); *H02M 5/458* (2013.01)

(58) Field of Classification Search
CPC ... H02M 5/458; G01R 31/52; G01R 31/2617; G01R 33/00; G01R 33/0035
See application file for complete search history.

(56) References Cited

U.S. PATENT DOCUMENTS

| | | | | |
|---|---|---|---|---|
| 3,944,921 A | * | 3/1976 | Tsuda | G01R 19/16557 |
| | | | | 324/133 |
| 2013/0181695 A1 | * | 7/2013 | Sakakibara | H02M 7/797 |
| | | | | 324/76.11 |
| 2015/0085552 A1 | * | 3/2015 | Inomata | H02M 5/297 |
| | | | | 363/163 |

FOREIGN PATENT DOCUMENTS

| | | | | |
|---|---|---|---|---|
| CN | 1773802 A | * | 5/2006 | ............ H02M 5/293 |
| KR | 20170099246 A | | 8/2017 | |

OTHER PUBLICATIONS

Tran, V.: "Short Circuit Fault Tolerant System for Matrix Converter", 8th IET International Conference on Power Electronics, Machines and Drives (PEMD 2016), Jan. 1, 2016, pp. 1-6. XP093071437, Figs. 1-5 DOI: 10.1049/cp.2016.0373 ISBN: 978-1-78561-188-9.

(Continued)

*Primary Examiner* — Jermele M Hollington
*Assistant Examiner* — Taqi R Nasir
(74) *Attorney, Agent, or Firm* — Muncy, Geissler, Olds & Lowe, P.C.

(57) ABSTRACT

A switch short-circuited diagnosis method includes steps of: determining an initial voltage interval of multiple voltage intervals according to voltage relationships between voltages of a first phase wire, a second phase wire, and a third phase wire; performing a switch short-circuited diagnosis of a first bidirectional switch module in the three consecutive voltage intervals from the initial voltage interval, and including steps of: turning on a first switch branch, a second switch branch, or a third switch branch of the first bidirectional switch module according to the voltage relationships between the voltages of the first, second and third phase wires, determining whether an overcurrent occurs to diagnose whether the first switch branch, the second switch branch, or the third switch branch of the first bidirectional (Continued)

switch module is in a short-circuited state, and performing the switch short-circuited diagnosis for the next voltage interval.

15 Claims, 9 Drawing Sheets

(56) References Cited

OTHER PUBLICATIONS

Wang, Li-Na et al: "Short-Circuit Fault Analysis and Isolation Strategy for Matrix Converters", Journal of Central South Universirt, Central South Universirt, Ceangsha, vol. 22, No. 9, Sep. 8, 2015, pp. 3458-3470, XP035543152, ISSN: 2095-2899, DOI: 10.1007/S11771-015-2886-Y [retrieved on Sep. 8, 2015]; Figs. 1-3.
Search Report dated Aug. 22, 2023 of the corresponding European patent application No. 23156901.3; pp. 1-35.

* cited by examiner

SWITCH SHORT-CIRCUITED DIAGNOSIS METHOD

BACKGROUND

Technical Field

The present disclosure relates to a switch short-circuited diagnosis method, and more particularly to a switch short-circuited diagnosis method applied to a matric converter.

Description of Related Art

In a converter circuit structure, such as a matrix converter (or called AC/AC converter), switching components may be short-circuited and damaged due to overcurrent, overvoltage and the like, during operation. Therefore, in the matrix converter, a failure among the switching components may not be observable from their operating voltages and currents when any single switch is short-circuited. If a motor is activated to operate in this situation, since the short-circuited abnormality of the switches cannot be detected in advance, a short-circuited current is likely to be generated to be harmful to the motor or an operator.

SUMMARY

An objective of the present disclosure is to provide a switch short-circuited diagnosis method to solve problems of the existing technology.

In order to achieve the above-mentioned objective, the switch short-circuited diagnosis method is provided for detecting a short-circuited state of a first bidirectional switch module. The first bidirectional switch module includes a first switch branch, a second switch branch, and a third switch branch. The first switch branch is coupled to a first phase wire of a three-phase power source, the second switch branch is coupled to a second phase wire of the three-phase power source, and the third switch branch is coupled to a third phase wire of the three-phase power source. The method includes steps of: determining an initial voltage interval of multiple voltage intervals according to voltage relationships between a voltage of the first phase wire, a voltage of the second phase wire, and a voltage of the third phase wire, and respectively performing a switch short-circuited diagnosis of the first bidirectional switch module from the initial voltage interval to the three consecutive voltage intervals, and includes steps of: turning on the first switch branch, the second switch branch, or the third switch branch of the first bidirectional switch module according to the voltage relationships between the voltage of the first phase wire, the voltage of the second phase wire, and the voltage of the third phase wire, determining whether an overcurrent occurs to diagnose whether the first switch branch, the second switch branch, or the third switch branch of the first bidirectional switch module is in the short-circuited state, and performing the switch short-circuited diagnosis for the next voltage interval.

Accordingly, by the switch-short circuit diagnosis method, it is possible to detect whether (any) short-circuited abnormality of switches occurs before the operation of the matrix converter, thereby avoiding damage to the motor or operators due to the short-circuited current generated after the matrix converter is activated.

It is to be understood that both the foregoing general description and the following detailed description are exemplary, and are intended to provide further explanation of the present disclosure as claimed. Other advantages and features of the present disclosure will be apparent from the following description, drawings, and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1:
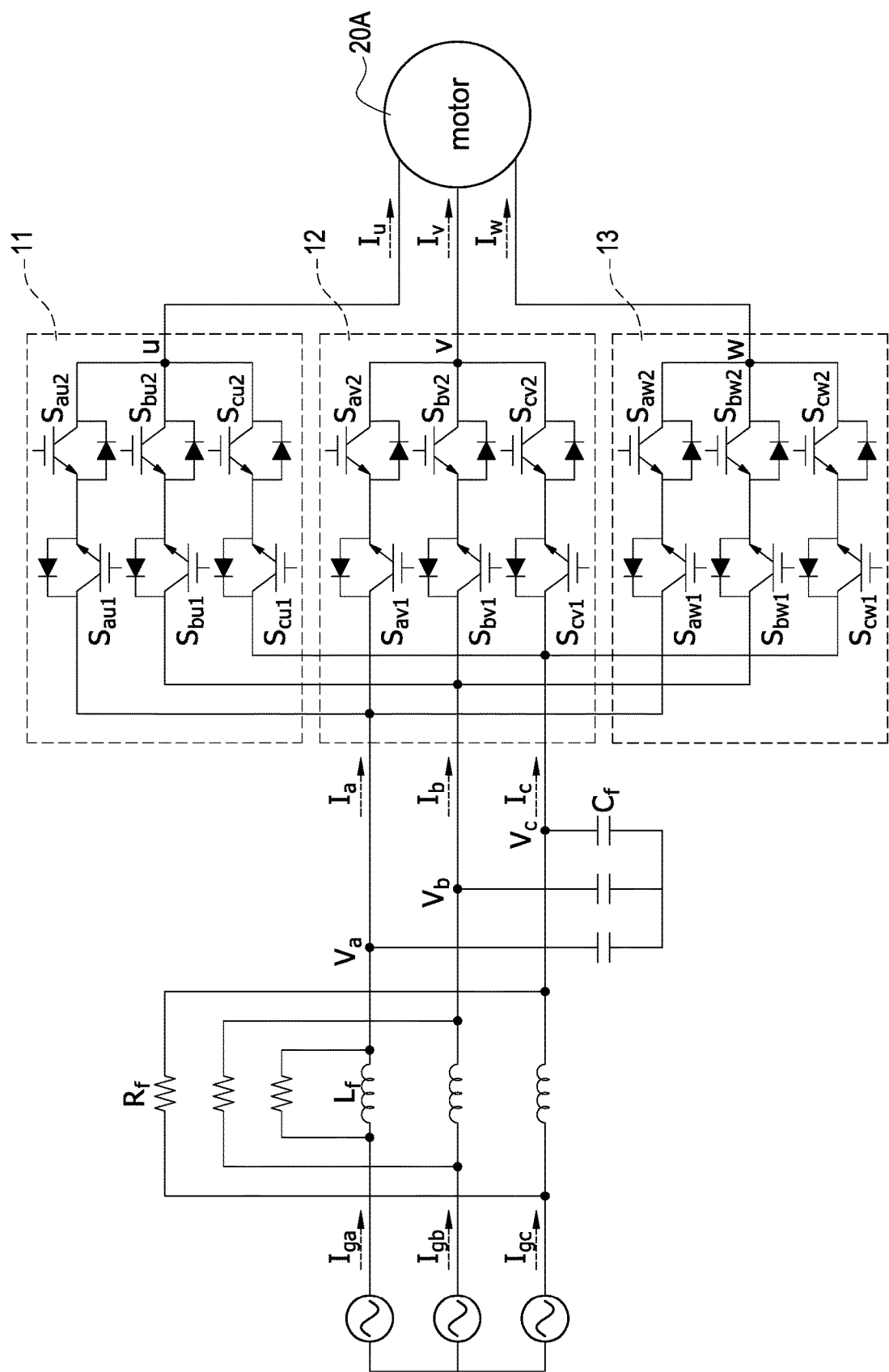
FIG. 1 is a circuit diagram of a matrix converter according to the present disclosure.

Reference will now be made to the drawing figures to describe the present disclosure in detail. It will be understood that the drawing figures and exemplified embodiments of present disclosure are not limited to the details thereof.

Please refer to FIG. 1, which shows a circuit diagram of a matrix converter according to the present disclosure. The switch short-circuited diagnosis method proposed in the present disclosure is applied to a matrix converter to a short-circuited abnormality of switches of the matrix converter. For the general traditional motor driver structure, it needs to convert an AC input power to a DC power by an AC-to-DC conversion, and then converter the DC power to an AC output power by a DC-to-AC conversion to drive and control the motor, and therefore a DC capacitor is required as energy buffer. In comparison with the general traditional motor driver structure, the matrix converter is a converter structure that converts the AC input power to the AC output power. By bidirectional AC-to-AC power conversion, the purpose of improving efficiency and prolonging product life can be achieved without using the DC capacitor as energy buffer.

As shown in FIG. 1, after the AC input power passes through the filter circuit, it is directly connected to the nine bidirectional switches Sau1-Scw2. Each bidirectional switch is formed by the back-to-back connection of two IGBTs (insulated gate bipolar transistors), and then the switches are connected to the motor 20A. In other words, the entire energy conversion system is directly converted from AC to AC, without using the processes of AC to DC and DC to AC. By measuring the output currents Iu, Iv, Iw or the rotational speed and position of the motor 20A, and then performing the conversion and commutation operations of pulse-width modulation (PWM), a drive command of driving the motor 20A is generated, thereby driving and controlling the motor 20A.

Figure 5A:
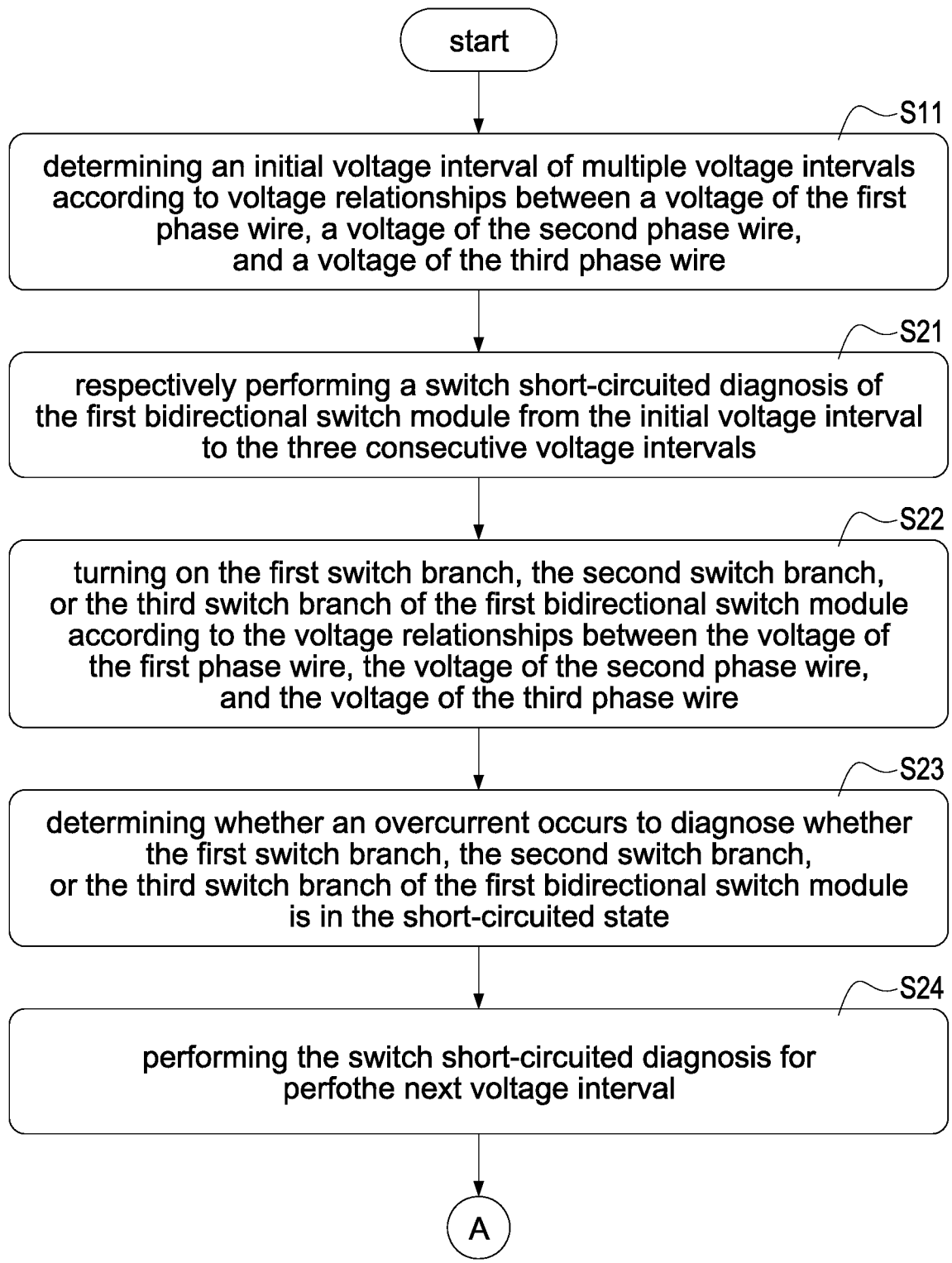
FIG. 5 (represented by FIG. 5A, FIG. 5B, and FIG. 5C) is a flowchart of a switch short-circuited diagnosis method.
Figure 5B:
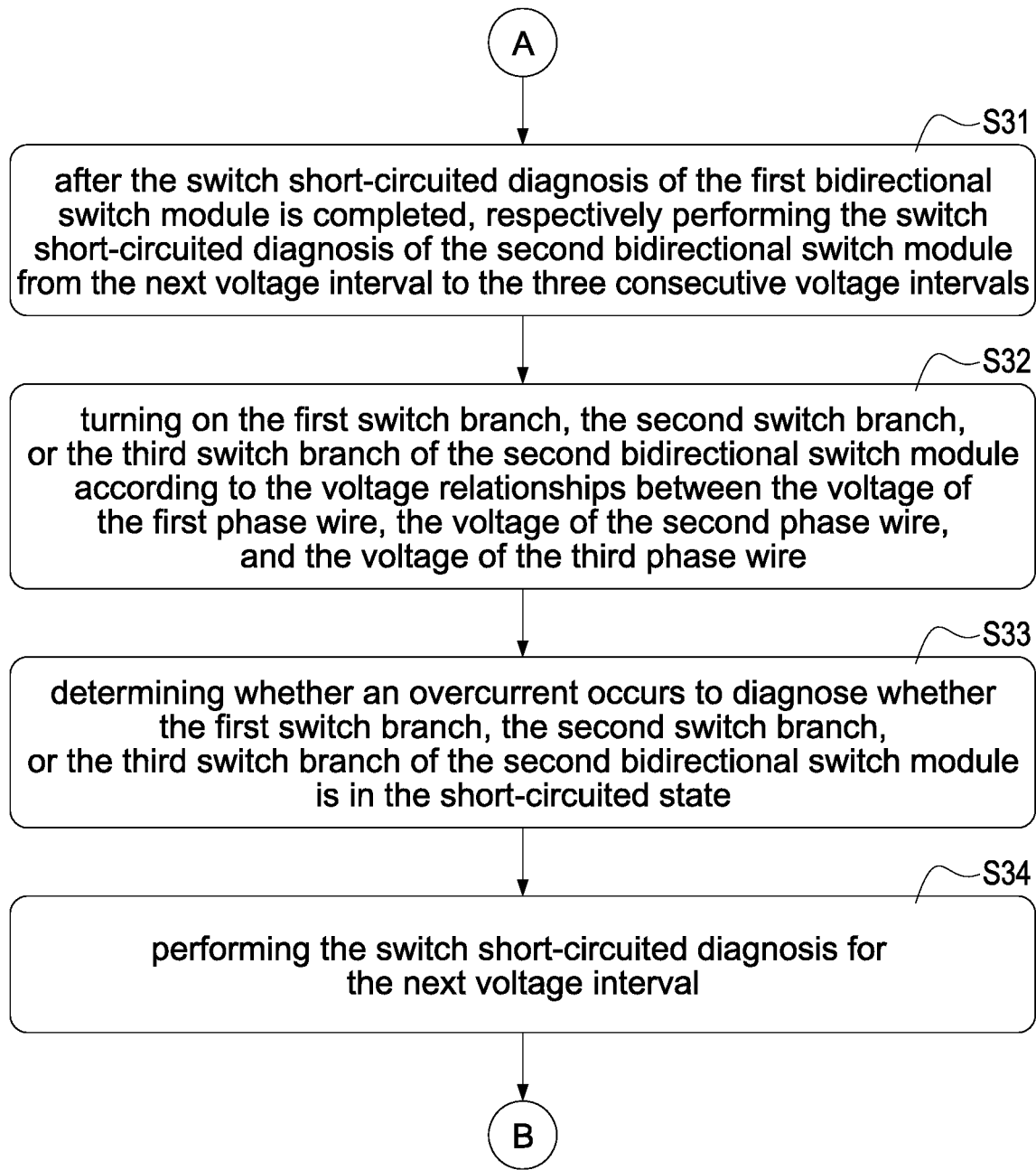
Figure 5C:
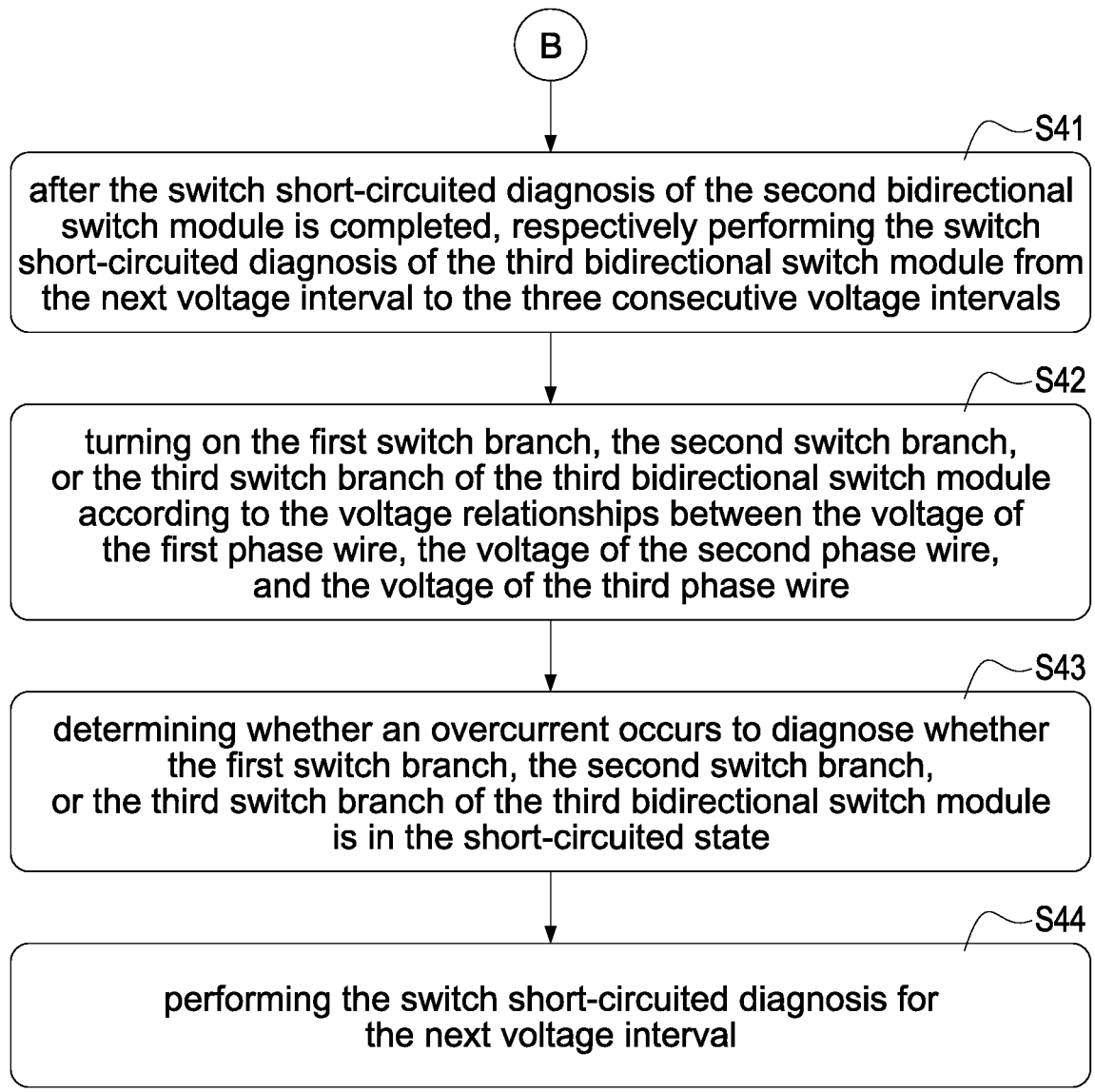

Please refer to FIG. 5 (represented by FIG. 5A, FIG. 5B, and FIG. 5C), which shows a flowchart of a switch short-circuited diagnosis method, and also refer to FIG. 1. The switch short-circuited diagnosis method proposed by the present disclosure is used to diagnose the short-circuited states of switches of the three bidirectional switch modules 11, 12, 13. Therefore, by the switch-short circuit diagnosis method, it is possible to detect whether (any) short-circuited abnormality of switches occurs before the operation of the matrix converter, thereby avoiding damage to the motor or operators due to the short-circuited current generated after the matrix converter is activated.

As shown in FIG. 1, each bidirectional switch module 11, 12, 13 includes a first switch branch, a second switch branch, and a third switch branch. Each switch branch includes a first switch and a second switch back-to-back connected in series. Therefore, the first bidirectional switch module 11 includes a first switch branch composed of the first switch Sau1 and the second switch Sau2 back-to-back connected in series, a second switch branch composed of the first switch Sbu1 and the second switch Sbu2 back-to-back connected in series, and a third switch branch composed of the first switch Scu1 and the second switch Scu2 back-to-back connected in series. Similarly, the second bidirectional switch module 12 includes a first switch branch composed of the first switch Sav1 and the second switch Sav2 back-to-back connected in series, a second switch branch composed of the first switch Sbv1 and the second switch Sbv2 back-to-back connected in series, and a third switch branch composed of the first switch Scv1 and the second switch Scv2 back-to-back connected in series. Similarly, the third bidirectional switch module 13 includes a first switch branch composed of the first switch Saw1 and the second switch Saw2 back-to-back connected in series, a second switch branch composed of the first switch Sbw1 and the second switch Sbw2 back-to-back connected in series, and a third switch branch composed of the first switch Scw1 and the second switch Scw2 back-to-back connected in series.

The first switch branch, the second switch branch, and the third switch branch are respectively coupled to three phases of a three-phase power source. That is, the first switch branch of the first bidirectional switch module 11, the first switch branch of the second bidirectional switch module 12, and the first switch branch of the third bidirectional switch module 13 are coupled to the first phase wire of the three-phase power source. The second switch branch of the first bidirectional switch module 11, the second switch branch of the second bidirectional switch module 12, and the second switch branch of the third bidirectional switch module 13 are coupled to the second phase wire of the three-phase power source. The third switch branch of the first bidirectional switch module 11, the third switch branch of the second bidirectional switch module 12, and the third switch branch of the third bidirectional switch module 13 are coupled to the third phase wire of the three-phase power source.

Figure 2:
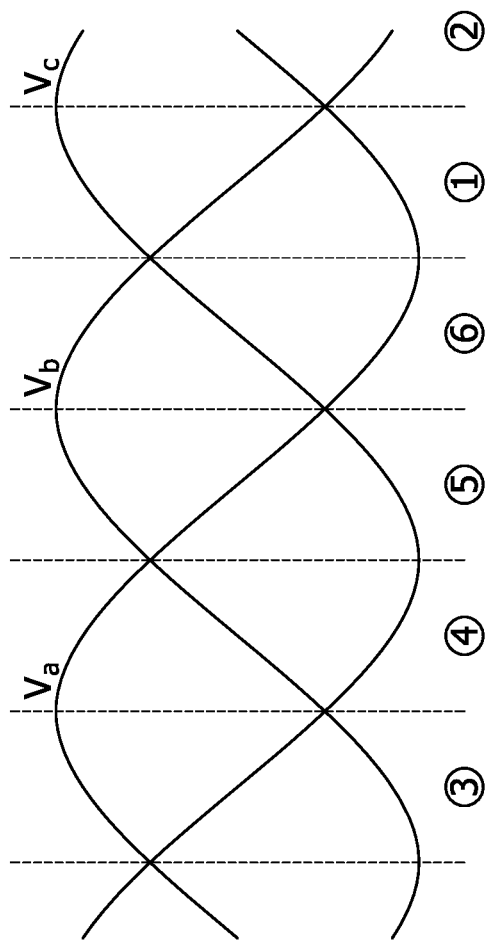
FIG. 2 is a schematic diagram of six voltage intervals determined according to the three phases according to the present disclosure.

As shown in FIG. 5 (represented by FIG. 5A, FIG. 5B, and FIG. 5C), the switch short-circuited diagnosis method includes steps of: first, determining an initial voltage interval of multiple voltage intervals according to voltage relationships between a voltage of the first phase wire, a voltage of the second phase wire, and a voltage of the third phase wire (S11). Please refer to FIG. 2, which shows a schematic diagram of six voltage intervals determined according to the three phases according to the present disclosure. The voltage of the first phase wire is Va, the voltage of the second phase wire is Vb, the voltage of the third phase wire is Vc, and each phase differs by 120 degrees in electrical angle. Therefore, the three phases can determine six voltage intervals, namely the voltage intervals ① to ⑥. Take the first voltage interval ① as an example, it is the interval in which the voltage Vc of the third phase wire is greater than the voltage Vb of the second phase wire and is greater than the voltage Va of the first phase wire. Similarly, the second voltage interval ② is the interval in which the voltage Vc of the third phase wire is greater than the voltage Va of the first phase wire and is greater than the voltage Vb of the second phase wire. The determination (definition) of other voltage intervals may be determined according to the voltage relationships between the voltages of the three phases, and the detail description is omitted here for conciseness.

Figure 3A:
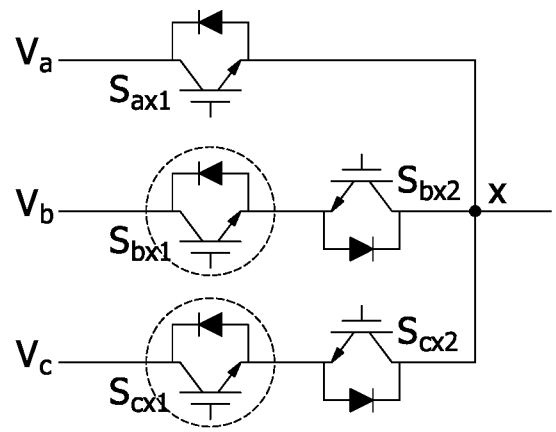
FIG. 3A to FIG. 3F are schematic diagrams showing states of the switch module in different voltage intervals according to a first embodiment of the present disclosure.

Please refer to FIG. 3A to FIG. 3F, which show schematic diagrams showing states of the switch module in different voltage intervals according to a first embodiment of the present disclosure. FIG. 3A shows switching states of the switches corresponding to the voltage interval ①, which means that the second switch Sax2 of the first switch branch of the bidirectional switch module is turned on according to the voltage relationships between the three phases in the voltage interval ① to detect whether a short-circuited occurs between the first switch Sbx1 of the second switch branch and the first switch Scx1 of the third switch branch. In particular, the symbol x may be u, v, and w respectively represent the first bidirectional switch module 11, the second bidirectional switch module 12, and the third bidirectional switch module 13.

Figure 3B:
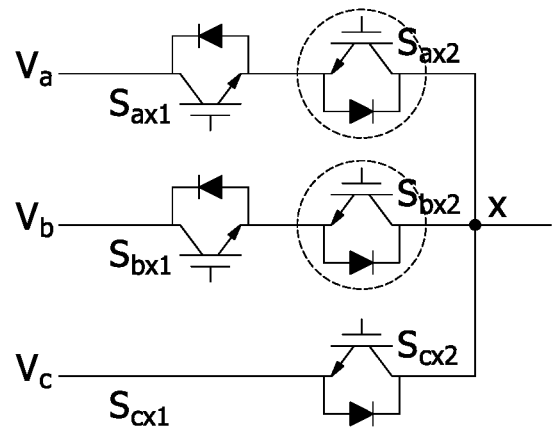

Similarly, FIG. 3B shows switching states of the switches corresponding to the voltage interval ②, which means that the first switch Scx1 of the third switch branch of the bidirectional switch module is turned on according to the voltage relationships between the three phases in the voltage interval ② to detect whether a short-circuited occurs between the second switch Sax2 of the first switch branch and the second switch Sbx2 of the second switch branch.

Figure 3C:
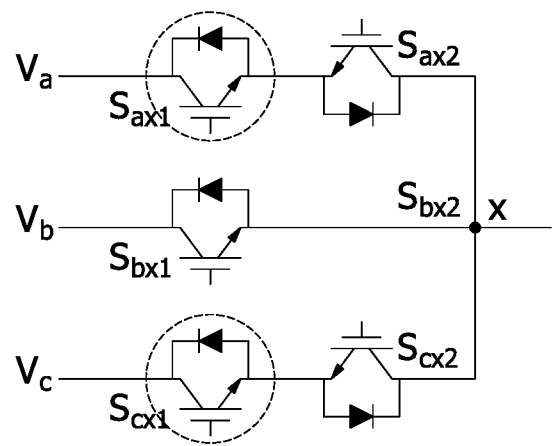

Similarly, FIG. 3C shows switching states of the switches corresponding to the voltage interval ③, which means that the second switch Sbx2 of the second switch branch of the bidirectional switch module is turned on according to the voltage relationships between the three phases in the voltage interval ③ to detect whether a short-circuited occurs between the first switch Sax1 of the first switch branch and the first switch Scx1 of the third switch branch.

Figure 3D:
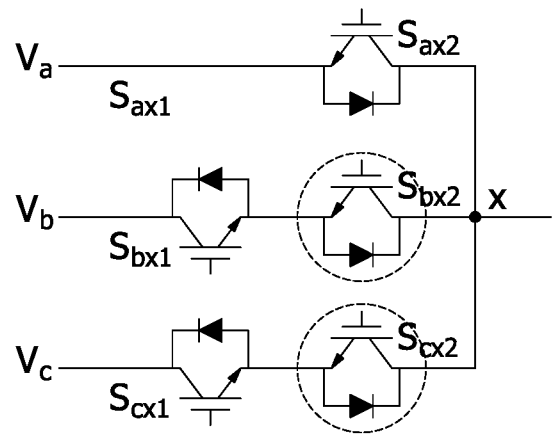

Similarly, FIG. 3D shows switching states of the switches corresponding to the voltage interval ④, which means that the first switch Sax1 of the first switch branch of the bidirectional switch module is turned on according to the voltage relationships between the three phases in the voltage interval ④ to detect whether a short-circuited occurs between the second switch Sbx2 of the second switch branch and the second switch Scx2 of the third switch branch.

Figure 3E:
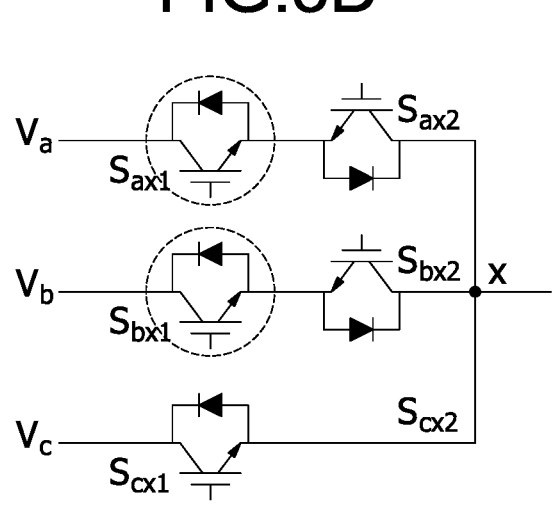

Similarly, FIG. 3E shows switching states of the switches corresponding to the voltage interval ⑤, which means that the second switch Scx2 of the third switch branch of the bidirectional switch module is turned on according to the voltage relationships between the three phases in the voltage interval ⑤ to detect whether a short-circuited occurs between the first switch Sax1 of the first switch branch and the first switch Sbx1 of the second switch branch.

Figure 3F:
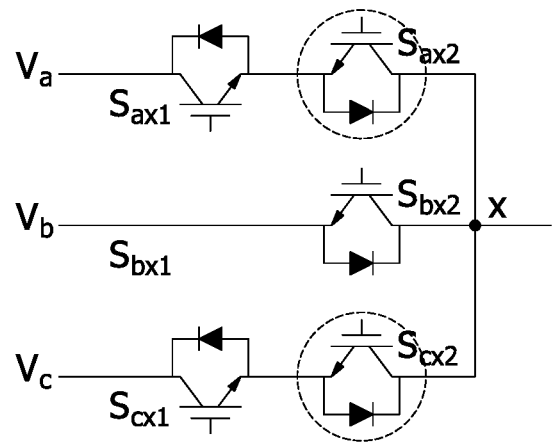
Figure 4A:
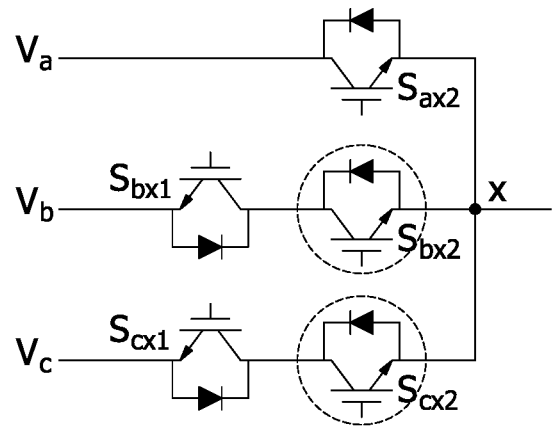
FIG. 4A to FIG. 4F are schematic diagrams showing states of the switch module in different voltage intervals according to a second embodiment of the present disclosure.
Figure 4B:
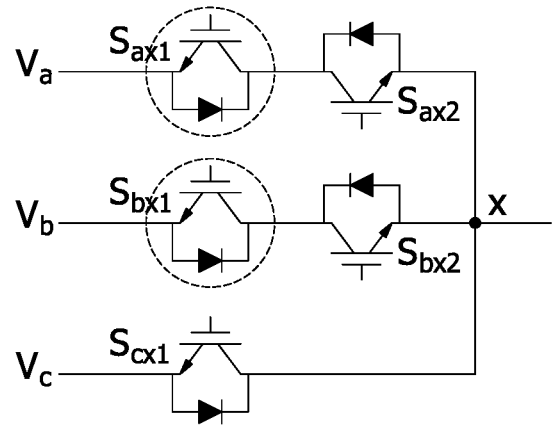
Figure 4C:
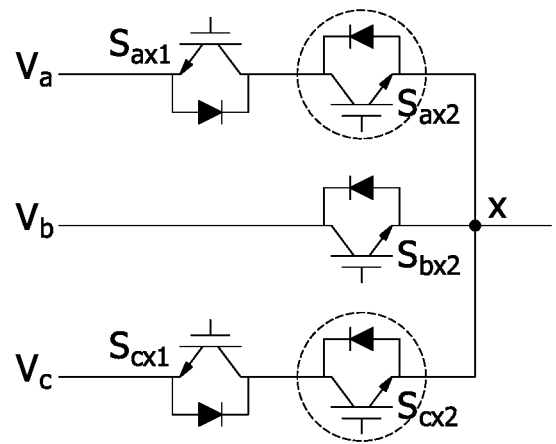
Figure 4D:
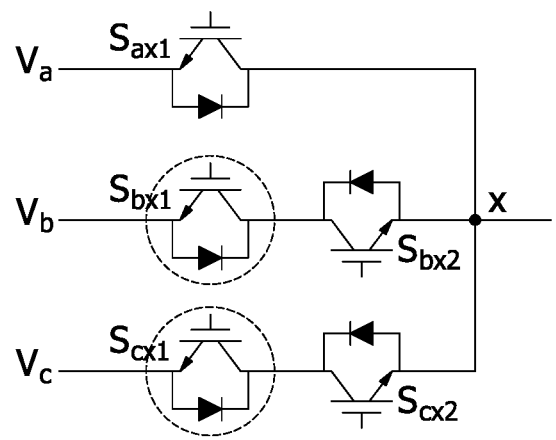
Figure 4E:
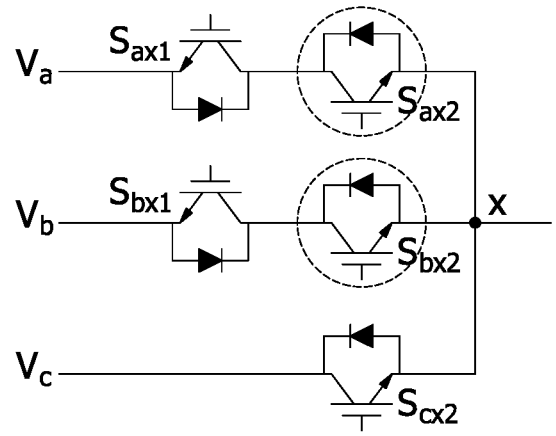
Figure 4F:
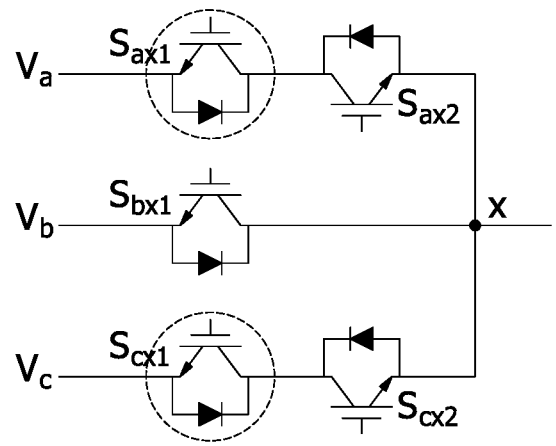

Similarly, FIG. 3F shows switching states of the switches corresponding to the voltage interval ⑥, which means that the first switch Sbx1 of the second switch branch of the bidirectional switch module is turned on according to the voltage relationships between the three phases in the voltage interval ⑥ to detect whether a short-circuited occurs between the second switch Sax2 of the first switch branch and the second switch Scx2 of the third switch branch.

Therefore, according to the voltage relationships and switch switching states of the six voltage intervals shown in FIG. 3A to FIG. 3F, it can be used to detect and diagnose whether all switches in the bidirectional switch modules are short-circuited abnormally.

After the step (S11), respectively performing a switch short-circuited diagnosis of the first bidirectional switch module from the initial voltage interval in the three consecutive voltage intervals (S21). Specifically, turning on the first switch branch, the second switch branch, or the third switch branch of the first bidirectional switch module according to the voltage relationships between the voltage of the first phase wire, the voltage of the second phase wire, and the voltage of the third phase wire (S22). Afterward, determining whether an overcurrent occurs to diagnose whether the first switch branch, the second switch branch, or the third switch branch of the first bidirectional switch module is in the short-circuited state (S23). Afterward, performing the switch short-circuited diagnosis for the next voltage interval (S24). For example, it may be selected, such as but not limited to, the voltage interval ① is used as the initial voltage interval, and there are three consecutive voltage intervals (i.e., the voltage intervals ② to ④). Therefore, the voltage relationships and the switch switching states in the four voltage intervals (i.e., voltage intervals ① to ④) shown in FIG. 3A (correspond to the voltage interval ①), FIG. 3B (correspond to the voltage interval ②), FIG. 3C (correspond to the voltage interval ③), and FIG. 3D (correspond to the voltage interval ④) are described as follows. Each of the first switch branch, the second switch branch, and the third switch branch includes a first switch and a second switch, and a first diode and a second diode. In this embodiment, a drain of the first switch is connected to a drain of the second switch. In particular, each of the first diode and the second diode is a body diode or a physical diode. The first diode is connected to the first switch in parallel, and the second diode is connected to the second switch in parallel. In this embodiment, an anode of the first diode is connected to an anode of the second diode.

Specifically, the step of "turning on the first switch branch, the second switch branch, or the third switch branch according to the voltage relationships between the voltage of the first phase wire, the voltage of the second phase wire, and the voltage of the third phase wire" includes: turning on the first switch of a switch branch coupled to a maximum voltage among the voltage of the first phase wire, the voltage of the second phase wire, and the voltage of the third phase wire so that the maximum voltage forwardly turns on the second diode of the second switch of the switch branch, or turning on the second switch of a switch branch coupled to a minimum voltage among the voltage of the first phase wire, the voltage of the second phase wire, and the voltage of the third phase wire so that the minimum voltage forwardly turns on the first diode of the first switch of the switch branch.

Take the turned-on operation using the maximum voltage among the voltage of the first phase wire, the voltage of the second phase wire, and the voltage of the third phase wire as an example. In the voltage interval ①, turning on the second switch Sau2 of the first switch branch of the first bidirectional switch module 11, and determining whether the overcurrent occurs to the first switch Sbu1 of the second switch branch of the first bidirectional switch module 11 and to the first switch Scu1 of the third switch branch of the first bidirectional switch module 11. If the current flowing through the second switch branch has an overcurrent, it means that the first switch Sbu1 of the second switch branch is abnormally short-circuited (at this time, the voltage Vb is greater than the voltage Va). In this condition, the maximum voltage forwardly turns on the first diode and the second diode corresponding to the switch branch, and therefore the second diode of the second switch Sbu2 of the second switch branch and the first diode of the first switch Sau1 of the first switch branch provide a forward current path. Alternatively, if the current flowing through the third switch branch has an overcurrent, it means that the first switch Scu1 of the third switch branch is abnormally short-circuited (at this time, the voltage Vc is greater than the voltage Va). In this condition, the second diode of the second switch Scu2 of the third switch branch and the first diode of the first switch Sau1 of the first switch branch provide a forward current path. On the contrary, if there is no overcurrent flowing through any switch branch, it means that no short-circuited abnormality occurs in any switch.

In the voltage interval ②, turning on the first switch Scu1 of the third switch branch of the first bidirectional switch module 11, and determining whether the overcurrent occurs to the second switch Sau2 of the first switch branch of the first bidirectional switch module 11 and to the second switch Sbu2 of the second switch branch of the first bidirectional switch module 11. If the current flowing through the first switch branch has an overcurrent, it means that the second switch Sau2 of the first switch branch is abnormally short-circuited (at this time, the voltage Vc is greater than the voltage Va). In this condition, the maximum voltage forwardly turns on the first diode and the second diode corresponding to the switch branch, and therefore the second diode of the second switch Scu2 of the third switch branch and the first diode of the first switch Sau1 of the first switch branch provide a forward current path. Alternatively, if the current flowing through the second switch branch has an overcurrent, it means that the second switch Sbu2 of the second switch branch is abnormally short-circuited (at this time, the voltage Vc is greater than the voltage Vb). In this condition, the second diode of the second switch Scu2 of the third switch branch and the first diode of the first switch Sbu1 of the second switch branch provide a forward current path. On the contrary, if there is no overcurrent flowing through any switch branch, it means that no short-circuited abnormality occurs in any switch.

In the voltage interval ②, turning on the first switch Scu1 of the third switch branch of the first bidirectional switch module 11, and determining whether the overcurrent occurs to the second switch Sau2 of the first switch branch of the first bidirectional switch module 11 and to the second switch Sbu2 of the second switch branch of the first bidirectional switch module 11. If the current flowing through the first switch branch has an overcurrent, it means that the second switch Sau2 of the first switch branch is abnormally short-circuited (at this time, the voltage Vc is greater than the voltage Va). In this condition, the maximum voltage forwardly turns on the first diode and the second diode corresponding to the switch branch, and therefore the second diode of the second switch Scu2 of the third switch branch and the first diode of the first switch Sau1 of the first switch branch provide a forward current path. Alternatively, if the current flowing through the second switch branch has an overcurrent, it means that the second switch Sbu2 of the second switch branch is abnormally short-circuited (at this time, the voltage Vc is greater than the voltage Vb). In this condition, the second diode of the second switch Scu2 of the third switch branch and the first diode of the first switch Sbu1 of the second switch branch provide a forward current path. On the contrary, if there is no overcurrent flowing through any switch branch, it means that no short-circuited abnormality occurs in any switch.

In the voltage interval ④, turning on the first switch Sau1 of the first switch branch of the first bidirectional switch module 11, and determining whether the overcurrent occurs to the second switch Scu2 of the third switch branch of the first bidirectional switch module 11 and to the second switch Scu2 of the third switch branch of the first bidirectional switch module 11. If the current flowing through the second switch branch has an overcurrent, it means that the second switch Sbu2 of the second switch branch is abnormally short-circuited (at this time, the voltage Va is greater than the voltage Vb). In this condition, the maximum voltage forwardly turns on the first diode and the second diode corresponding to the switch branch, and therefore the second diode of the second switch Sau2 of the first switch branch and the first diode of the first switch Sbu1 of the second switch branch provide a forward current path. Alternatively, if the current flowing through the third switch branch has an overcurrent, it means that the second switch Scu2 of the third switch branch is abnormally short-circuited (at this time, the voltage Va is greater than the voltage Vc). In this condition, the second diode of the second switch Sau2 of the first switch branch and the first diode of the first switch Scu1 of the third switch branch provide a forward current path. On the contrary, if there is no overcurrent flowing through any switch branch, it means that no short-circuited abnormality occurs in any switch.

Therefore, whether the short-circuited abnormality of the first switches and the second switches of all switch branches of the first bidirectional switch module 11 can be diagnosed according to the control of the corresponding switches in the above-mentioned four voltage intervals (i.e., the voltage intervals ① to ④) and the detection of whether the current value of the corresponding switch branch has an overcurrent abnormality.

Incidentally, it is also possible to diagnose whether the short-circuited abnormality of the first switches and the second switches of all switch branches of the first bidirectional switch module 11 by using the minimum voltage turned-on operation. The only difference is that different first diodes and second diodes are forwardly turned on by the minimum voltage to form different current paths as determination. The technical spirit may be compared with the maximum voltage turned-on operation, and the detail description is omitted here for conciseness.

After the step (S24), that is after the switch short-circuited diagnosis of the first bidirectional switch module is completed, respectively performing the switch short-circuited diagnosis of the second bidirectional switch module from the next voltage interval to the three consecutive voltage intervals (S31). Specifically, turning on the first switch branch, the second switch branch, or the third switch branch of the second bidirectional switch module according to the voltage relationships between the voltage of the first phase wire, the voltage of the second phase wire, and the voltage of the third phase wire (S32). Afterward, determining whether an overcurrent occurs to diagnose whether the first switch branch, the second switch branch, or the third switch branch of the second bidirectional switch module is in the short-circuited state (S33). Afterward, performing the switch short-circuited diagnosis for the next voltage interval (S34).

For example, the "four consecutive voltage intervals" are the voltage intervals ⑤ to ② following the voltage interval ④. Therefore, the voltage relationships and the switch switching states in the four voltage intervals (i.e., voltage intervals ⑤ to ②) shown in FIG. 3E (correspond to the voltage interval ⑤), FIG. 3F (correspond to the voltage interval ⑥), FIG. 3A (correspond to the voltage interval ①), and FIG. 3B (correspond to the voltage interval ②) are described as follows. By turning on the corresponding first switches or second switches of the second bidirectional switch module 12, if the current flowing through the first switch branch, the second switch branch, or the third switch branch has an overcurrent, it means that the first switch or the second switch flowing through the overcurrent is abnormally short-circuited.

In the voltage interval ⑤, turning on the second switch Scv2 of the third switch branch of the second bidirectional switch module 12, and determining whether the overcurrent occurs to the first switch Sav1 of the first switch branch of the second bidirectional switch module 12 and to the first switch Sbv1 of the second switch branch of the second bidirectional switch module 12. If the current flowing through the first switch branch has an overcurrent, it means that the first switch Sav1 of the first switch branch is abnormally short-circuited (at this time, the voltage Va is greater than the voltage Vc). In this condition, the maximum voltage forwardly turns on the first diode and the second diode corresponding to the switch branch, and therefore the second diode of the second switch Sau2 of the first switch branch and the first diode of the first switch Scu1 of the third switch branch provide a forward current path. Alternatively, if the current flowing through the second switch branch has an overcurrent, it means that the first switch Sbv1 of the second switch branch is abnormally short-circuited (at this time, the voltage Vb is greater than the voltage Vc). In this condition, the second diode of the second switch Sbu2 of the second switch branch and the first diode of the first switch Scu1 of the third switch branch provide a forward current path. On the contrary, if there is no overcurrent flowing through any switch branch, it means that no short-circuited abnormality occurs in any switch.

In the voltage interval ⑥, turning on the first switch Sbv1 of the second switch branch of the second bidirectional switch module 12, and determining whether the overcurrent occurs to the second switch Sav2 of the first switch branch of the second bidirectional switch module 12 and to the second switch Scv2 of the third switch branch of the second bidirectional switch module 12. If the current flowing through the first switch branch has an overcurrent, it means that the second switch Sav2 of the first switch branch is abnormally short-circuited (at this time, the voltage Vb is greater than the voltage Va). In this condition, the maximum voltage forwardly turns on the first diode and the second diode corresponding to the switch branch, and therefore the second diode of the second switch Sbu2 of the second switch branch and the first diode of the first switch Sau1 of the first switch branch provide a forward current path. Alternatively, if the current flowing through the third switch branch has an overcurrent, it means that the second switch Scv2 of the third switch branch is abnormally short-circuited (at this time, the voltage Vb is greater than the voltage Vc). In this condition, the second diode of the second switch Sbu2 of the second switch branch and the first diode of the first switch Scu1 of the third switch branch provide a forward current path. On the contrary, if there is no overcurrent flowing through any switch branch, it means that no short-circuited abnormality occurs in any switch.

In the voltage interval ①, turning on the second switch Sav2 of the first switch branch of the second bidirectional switch module 12, and determining whether the overcurrent occurs to the first switch Sbv1 of the second switch branch of the second bidirectional switch module 12 and to the first switch Scv1 of the third switch branch of the second bidirectional switch module 12. If the current flowing through the second switch branch has an overcurrent, it means that the first switch Sbv1 of the second switch branch is abnormally short-circuited (at this time, the voltage Vb is greater than the voltage Va). In this condition, the maximum voltage forwardly turns on the first diode and the second diode corresponding to the switch branch, and therefore the second diode of the second switch Sbv2 of the second switch branch and the first diode of the first switch Sav1 of the first switch branch provide a forward current path. Alternatively, if the current flowing through the third switch branch has an overcurrent, it means that the first switch Scv1 of the third switch branch is abnormally short-circuited (at this time, the voltage Vc is greater than the voltage Va). In this condition, the second diode of the second switch Scv2 of the third switch branch and the first diode of the first switch Sav1 of the first switch branch provide a forward current path. On the contrary, if there is no overcurrent flowing through any switch branch, it means that no short-circuited abnormality occurs in any switch.

In the voltage interval ②, turning on the first switch Scv1 of the third switch branch of the second bidirectional switch module 12, and determining whether the overcurrent occurs to the second switch Sav2 of the first switch branch of the second bidirectional switch module 12 and to the second switch Sbv2 of the second switch branch of the second bidirectional switch module 12. If the current flowing through the first switch branch has an overcurrent, it means that the second switch Sav2 of the first switch branch is abnormally short-circuited (at this time, the voltage Vc is greater than the voltage Va). In this condition, the maximum voltage forwardly turns on the first diode and the second diode corresponding to the switch branch, and therefore the second diode of the second switch Scv2 of the third switch branch and the first diode of the first switch Sav1 of the first switch branch provide a forward current path. Alternatively, if the current flowing through the second switch branch has an overcurrent, it means that the second switch Sbv2 of the second switch branch is abnormally short-circuited (at this time, the voltage Vc is greater than the voltage Vb). In this condition, the second diode of the second switch Scv2 of the third switch branch and the first diode of the first switch Sbv1 of the second switch branch provide a forward current path. On the contrary, if there is no overcurrent flowing through any switch branch, it means that no short-circuited abnormality occurs in any switch.

Therefore, whether the short-circuited abnormality of the first switches and the second switches of all switch branches of the first bidirectional switch module 11 can be diagnosed according to the control of the corresponding switches in the above-mentioned four voltage intervals (i.e., the voltage intervals ⑤ to ②) and the detection of whether the current value of the corresponding switch branch has an overcurrent abnormality.

After the step (S34), that is after the switch short-circuited diagnosis of the second bidirectional switch module is completed, respectively performing the switch short-circuited diagnosis of the third bidirectional switch module from the next voltage interval to the three consecutive voltage intervals (S41). Specifically, turning on the first switch branch, the second switch branch, or the third switch branch of the third bidirectional switch module according to the voltage relationships between the voltage of the first phase wire, the voltage of the second phase wire, and the voltage of the third phase wire (S42). Afterward, determining whether an overcurrent occurs to diagnose whether the first switch branch, the second switch branch, or the third switch branch of the third bidirectional switch module is in the short-circuited state (S43). Afterward, performing the switch short-circuited diagnosis for the next voltage interval (S44).

For example, the "four consecutive voltage intervals" are the voltage intervals ③ to ⑥ following the voltage interval ②. Therefore, the voltage relationships and the switch switching states in the four voltage intervals (i.e., voltage intervals ③ to ⑥) shown in FIG. 3C (correspond to the voltage interval ③), FIG. 3D (correspond to the voltage interval ④), FIG. 3E (correspond to the voltage interval ⑤), and FIG. 3F (correspond to the voltage interval ⑥) are described as follows. By turning on the corresponding first switches or second switches of the third bidirectional switch module 13, if the current flowing through the first switch branch, the second switch branch, or the third switch branch has an overcurrent, it means that the first switch or the second switch flowing through the overcurrent is abnormally short-circuited.

In the voltage interval ③, turning on the first switch Sbw2 of the second switch branch of the third bidirectional switch module 13, and determining whether the overcurrent occurs to the first switch Saw1 of the first switch branch of the third bidirectional switch module 13 and to the first switch Scw1 of the third switch branch of the third bidirectional switch module 13. If the current flowing through the first switch branch has an overcurrent, it means that the first switch Saw1 of the first switch branch is abnormally short-circuited (at this time, the voltage Va is greater than the voltage Vb). In this condition, the maximum voltage forwardly turns on the first diode and the second diode corresponding to the switch branch, and therefore the second diode of the second switch Saw2 of the first switch branch and the first diode of the first switch Sbw1 of the second switch branch provide a forward current path. Alternatively, if the current flowing through the third switch branch has an overcurrent, it means that the first switch Scw1 of the third switch branch is abnormally short-circuited (at this time, the voltage Vc is greater than the voltage Vb). In this condition, the second diode of the second switch Scw2 of the third switch branch and the first diode of the first switch Sbw1 of the second switch branch provide a forward current path. On the contrary, if there is no overcurrent flowing through any switch branch, it means that no short-circuited abnormality occurs in any switch.

In the voltage interval ④, turning on the first switch Saw1 of the first switch branch of the third bidirectional switch module 13, and determining whether the overcurrent occurs to the second switch Saw2 of the second switch branch of the third bidirectional switch module 13 and to the second switch Scw2 of the third switch branch of the third bidirectional switch module 13. If the current flowing through the second switch branch has an overcurrent, it means that the second switch Sbw2 of the second switch branch is abnormally short-circuited (at this time, the voltage Va is greater than the voltage Vb). In this condition, the maximum voltage forwardly turns on the first diode and the second diode corresponding to the switch branch, and therefore the second diode of the second switch Saw2 of the first switch branch and the first diode of the first switch Sbw1 of the second switch branch provide a forward current path. Alternatively, if the current flowing through the third switch branch has an overcurrent, it means that the second switch Scw2 of the third switch branch is abnormally short-circuited (at this time, the voltage Va is greater than the voltage Vc). In this condition, the second diode of the second switch Saw2 of the first switch branch and the first diode of the first switch Scw1 of the third switch branch provide a forward current path. On the contrary, if there is no overcurrent flowing through any switch branch, it means that no short-circuited abnormality occurs in any switch.

In the voltage interval ⑤, turning on the second switch Sbw2 of the third switch branch of the third bidirectional switch module 13, and determining whether the overcurrent occurs to the first switch Saw1 of the first switch branch of the third bidirectional switch module 13 and to the first switch Sbw1 of the second switch branch of the third bidirectional switch module 13. If the current flowing through the first switch branch has an overcurrent, it means that the first switch Sbw1 of the first switch branch is abnormally short-circuited (at this time, the voltage Va is greater than the voltage Vc). In this condition, the maximum voltage forwardly turns on the first diode and the second diode corresponding to the switch branch, and therefore the second diode of the second switch Saw2 of the first switch branch and the first diode of the first switch Scw1 of the third switch branch provide a forward current path. Alternatively, if the current flowing through the second switch branch has an overcurrent, it means that the first switch Sbw1 of the second switch branch is abnormally short-circuited (at this time, the voltage Vb is greater than the voltage Vc). In this condition, the second diode of the second switch Sbw2 of the second switch branch and the first diode of the first switch Scw1 of the third switch branch provide a forward current path. On the contrary, if there is no overcurrent flowing through any switch branch, it means that no short-circuited abnormality occurs in any switch.

In the voltage interval ⑥, turning on the first switch Sbw1 of the second switch branch of the third bidirectional switch module 13, and determining whether the overcurrent occurs to the second switch Saw2 of the first switch branch of the third bidirectional switch module 13 and to the second switch Scw2 of the third switch branch of the third bidirectional switch module 13. If the current flowing through the first switch branch has an overcurrent, it means that the second switch Saw2 of the first switch branch is abnormally short-circuited (at this time, the voltage Vb is greater than the voltage Va). In this condition, the maximum voltage forwardly turns on the first diode and the second diode corresponding to the switch branch, and therefore the second diode of the second switch Sbw2 of the second switch branch and the first diode of the first switch Saw1 of the first switch branch provide a forward current path. Alternatively, if the current flowing through the third switch branch has an overcurrent, it means that the second switch Scw2 of the third switch branch is abnormally short-circuited (at this time, the voltage Vb is greater than the voltage Vc). In this condition, the second diode of the second switch Sbw2 of the second switch branch and the first diode of the first switch Scw1 of the third switch branch provide a forward current path. On the contrary, if there is no overcurrent flowing through any switch branch, it means that no short-circuited abnormality occurs in any switch.

Therefore, whether the short-circuited abnormality of the first switches and the second switches of all switch branches of the first bidirectional switch module 11 can be diagnosed according to the control of the corresponding switches in the above-mentioned four voltage intervals (i.e., the voltage intervals ③ to ⑥) and the detection of whether the current value of the corresponding switch branch has an overcurrent abnormality.

Accordingly, according to steps S11 to S44, it is possible to diagnose whether the first switches and the second switches of all switch branches of all switch modules 11, 12, 13 are abnormally short-circuited. Therefore, by the switch-short circuit diagnosis method, it is possible to detect whether (any) short-circuited abnormality of switches occurs before the operation of the matrix converter, thereby avoiding damage to the motor or operators due to the short-circuited current generated after the matrix converter is activated.

Moreover, please refer to FIG. 4A to FIG. 4F, which show schematic diagrams showing states of the switch module in different voltage intervals according to a second embodiment of the present disclosure. The major difference between FIG. 4A to FIG. 4F and FIG. 3A to FIG. 3F is that the source of the first switch is connected to the source of the second switch, and the cathode of the first diode is connected to the cathode of the second diode. Similarly, the turned-on operation using the maximum voltage and the turned-on operation using the minimum voltage can to diagnose whether the first switches and the second switches of all switch branches of all switch modules 11, 12, 13 are abnormally short-circuited. The technical means can be analogous to the contents disclosed in FIG. 3A to FIG. 3F, and the detail description is omitted here for conciseness.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A switch short-circuited diagnosis method, configured for detecting a short-circuited state of a first bidirectional switch module; the first bidirectional switch module comprising a first switch branch, a second switch branch, and a third switch branch; the first switch branch being coupled to a first phase wire of a three-phase power source, the second switch branch being coupled to a second phase wire of the three-phase power source, and the third switch branch being coupled to a third phase wire of the three-phase power source, the method comprising steps of:
    determining an initial voltage interval of multiple voltage intervals according to voltage relationships between a voltage of the first phase wire, a voltage of the second phase wire, and a voltage of the third phase wire; and
    respectively performing the switch short-circuited diagnosis of the first bidirectional switch module from the initial voltage interval to the three consecutive voltage intervals, and comprising steps of:
    turning on the first switch branch, the second switch branch, or the third switch branch of the first bidirectional switch module according to the voltage relationships between the voltage of the first phase wire, the voltage of the second phase wire, and the voltage of the third phase wire;
    determining whether an overcurrent occurs to diagnose whether the first switch branch, the second switch branch, or the third switch branch of the first bidirectional switch module is in the short-circuited state; and
    performing the switch short-circuited diagnosis for the next voltage interval.

2. The switch short-circuited diagnosis method of claim 1, further configured for detecting a short-circuited state of a second bidirectional switch module and a short-circuited state of a third bidirectional switch module; each of the second bidirectional switch module and the third bidirectional switch module comprising a first switch branch, a second switch branch, and a third switch branch; the first switch branch being coupled to the first phase wire, the second switch branch being coupled to the second phase wire, and the third switch branch being coupled to the third phase wire, the method comprising:
- after the switch short-circuited diagnosis of the first bidirectional switch module is completed, respectively performing the switch short-circuited diagnosis of the second bidirectional switch module from the next voltage interval to the three consecutive voltage intervals, and comprising steps of:
- turning on the first switch branch, the second switch branch, or the third switch branch of the second bidirectional switch module according to the voltage relationships between the voltage of the first phase wire, the voltage of the second phase wire, and the voltage of the third phase wire;
- determining whether an overcurrent occurs to diagnose whether the first switch branch, the second switch branch, or the third switch branch of the second bidirectional switch module is in the short-circuited state; and
- performing the switch short-circuited diagnosis for the next voltage interval;
- after the switch short-circuited diagnosis of the second bidirectional switch module is completed, respectively performing the switch short-circuited diagnosis of the third bidirectional switch module from the next voltage interval to the three consecutive voltage intervals, and comprising steps of:
- turning on the first switch branch, the second switch branch, or the third switch branch of the third bidirectional switch module according to the voltage relationships between the voltage of the first phase wire, the voltage of the second phase wire, and the voltage of the third phase wire;
- determining whether an overcurrent occurs to diagnose whether the first switch branch, the second switch branch, or the third switch branch of the third bidirectional switch module is in the short-circuited state; and
- performing the switch short-circuited diagnosis for the next voltage interval.

3. The switch short-circuited diagnosis method of claim 2, wherein the step of "determining whether the overcurrent occurs to diagnose whether the first switch branch, the second switch branch, or the third switch branch of the first bidirectional switch module, the second bidirectional switch module, or the third bidirectional switch module is in the short-circuited state" comprises:
- if the overcurrent occurs, the first switch branch, the second switch branch, or the third switch branch is in the short-circuited state; and
- if the overcurrent does not occur, the first switch branch, the second switch branch, or the third switch branch is not in the short-circuited state.

4. The switch short-circuited diagnosis method of claim 2, wherein each of the first switch branch, the second switch branch, and the third switch branch comprises:
- a first switch;
- a second switch, back-to-back connected in series to the first switch, wherein a source of the first switch is connected to a source of the second switch;
- a first diode, connected to the first switch in parallel; and
- a second diode, connected to the second switch in parallel, wherein a cathode of the first diode is connected to a cathode of the second diode, wherein each of the first diode and the second diode is a body diode or a physical diode.

5. The switch short-circuited diagnosis method of claim 4, wherein the step of "turning on the first switch branch, the second switch branch, or the third switch branch according to the voltage relationships between the voltage of the first phase wire, the voltage of the second phase wire, and the voltage of the third phase wire" comprises:
- turning on the first switch of a switch branch coupled to a maximum voltage among the voltage of the first phase wire, the voltage of the second phase wire, and the voltage of the third phase wire, so that the maximum voltage forwardly turns on the second diode of the second switch of the switch branch; or
- turning on the second switch of a switch branch coupled to a minimum voltage among the voltage of the first phase wire, the voltage of the second phase wire, and the voltage of the third phase wire, so that the minimum voltage forwardly turns on the first diode of the first switch of the switch branch.

6. The switch short-circuited diagnosis method of claim 4, wherein the plurality of voltage intervals is cyclic six voltage intervals, including a first voltage interval, a second voltage interval, a third voltage interval, a fourth voltage interval, a fifth voltage interval, and a sixth voltage interval;
- wherein in the first voltage interval, the voltage of the third phase wire is greater than the voltage of the second phase wire, and the voltage of the second phase wire is greater than the voltage of the first phase wire;
- in the second voltage interval, the voltage of the third phase wire is greater than the voltage of the first phase wire, and the voltage of the first phase wire is greater than the voltage of the second phase wire;
- in the third voltage interval, the voltage of the first phase wire is greater than the voltage of the third phase wire, and the voltage of the third phase wire is greater than the voltage of the second phase wire;
- in the fourth voltage interval, the voltage of the first phase wire is greater than the voltage of the second phase wire, and the voltage of the second phase wire is greater than the voltage of the third phase wire;
- in the fifth voltage interval, the voltage of the second phase wire is greater than the voltage of the first phase wire, and the voltage of the first phase wire is greater than the voltage of the third phase wire; and
- in the sixth voltage interval, the voltage of the second phase wire is greater than the voltage of the third phase wire, and the voltage of the third phase wire is greater than the voltage of the first phase wire.

7. The switch short-circuited diagnosis method of claim 6, wherein when the initial voltage interval is the first voltage interval, the step of "respectively performing the switch short-circuited diagnosis to the first bidirectional switch module from the initial voltage interval to the three consecutive voltage intervals" comprises:
- in the first voltage interval, turning on the second switch of the first switch branch of the first bidirectional switch module, and determining whether the overcurrent occurs to the first switch of the second switch branch of the first bidirectional switch module and to the first switch of the third switch branch of the first bidirectional switch module;
- in the second voltage interval, turning on the first switch of the third switch branch of the first bidirectional switch module, and determining whether the overcurrent occurs to the second switch of the first switch branch of the first bidirectional switch module and to the second switch of the second switch branch of the first bidirectional switch module;

in the third voltage interval, turning on the second switch of the second switch branch of the first bidirectional switch module, and determining whether the overcurrent occurs to the first switch of the first switch branch of the first bidirectional switch module and to the first switch of the third switch branch of the first bidirectional switch module; and in the fourth voltage interval, turning on the first switch of the first switch branch of the first bidirectional switch module, and determining whether the overcurrent occurs to the second switch of the second switch branch of the first bidirectional switch module and to the second switch of the third switch branch of the first bidirectional switch module.

8. The switch short-circuited diagnosis method of claim 6, wherein when the initial voltage interval is the first voltage interval, the step of "after the switch short-circuited diagnosis to the first bidirectional switch module is completed, respectively performing the switch short-circuited diagnosis to the second bidirectional switch module from the next voltage interval to the three consecutive voltage intervals" comprises:

in the fifth voltage interval, turning on the second switch of the third switch branch of the second bidirectional switch module, and determining whether the overcurrent occurs to the first switch of the first switch branch of the second bidirectional switch module and to the first switch of the second switch branch of the second bidirectional switch module;

in the sixth voltage interval, turning on the first switch of the second switch branch of the second bidirectional switch module, and determining whether the overcurrent occurs to the second switch of the first switch branch of the second bidirectional switch module and to the second switch of the third switch branch of the second bidirectional switch module;

in the first voltage interval, turning on the second switch of the first switch branch of the second bidirectional switch module, and determining whether the overcurrent occurs to the first switch of the second switch branch of the second bidirectional switch module and to the first switch of the third switch branch of the second bidirectional switch module; and in the second voltage interval, turning on the first switch of the third switch branch of the second bidirectional switch module, and determining whether the overcurrent occurs to the second switch of the first switch branch of the second bidirectional switch module and to the second switch of the second switch branch of the second bidirectional switch module.

9. The switch short-circuited diagnosis method of claim 6, wherein when the initial voltage interval is the first voltage interval, the step of "after the switch short-circuited diagnosis of the second bidirectional switch module is completed, respectively performing the switch short-circuited diagnosis of the third bidirectional switch module from the next voltage interval to the three consecutive voltage intervals" comprises:

in the third voltage interval, turning on the second switch of the second switch branch of the third bidirectional switch module, and determining whether the overcurrent occurs to the first switch of the first switch branch of the third bidirectional switch module and to the first switch of the third switch branch of the third bidirectional switch module;

in the fourth voltage interval, turning on the first switch of the first switch branch of the third bidirectional switch module, and determining whether the overcurrent occurs to the second switch of the second switch branch of the third bidirectional switch module and to the second switch of the third switch branch of the third bidirectional switch module;

in the fifth voltage interval, turning on the second switch of the third switch branch of the third bidirectional switch module, and determining whether the overcurrent occurs to the first switch of the first switch branch of the third bidirectional switch module and to the first switch of the second switch branch of the third bidirectional switch module; and in the sixth voltage interval, turning on the first switch of the second switch branch of the third bidirectional switch module, and determining whether the overcurrent occurs to the second switch of the first switch branch of the third bidirectional switch module and to the second switch of the third switch branch of the third bidirectional switch module.

10. The switch short-circuited diagnosis method of claim 2, each of the first switch branch, the second switch branch, and the third switch branch comprises:

a first switch;

a second switch, back-to-back connected in series to the first switch, wherein a drain of the first switch is connected to a drain of the second switch;

a first diode, connected to the first switch in parallel; and a second diode, connected to the second switch in parallel, wherein an anode of the second diode is connected to an anode of the second diode, wherein each of the first diode and the second diode is a body diode or a physical diode.

11. The switch short-circuited diagnosis method of claim 10, wherein the step of "turning on the first switch branch, the second switch branch, or the third switch branch according to the voltage relationships between the voltage of the first phase wire, the voltage of the second phase wire, and the voltage of the third phase wire" comprises:

turning on the second switch of a switch branch coupled to a maximum voltage among the voltage of the first phase wire, the voltage of the second phase wire, and the voltage of the third phase wire, so that the maximum voltage forwardly turns on the second diode of the second switch of the switch branch; or turning on the first switch of a switch branch coupled to a minimum voltage among the voltage of the first phase wire, the voltage of the second phase wire, and the voltage of the third phase wire, so that the minimum voltage forwardly turns on the first diode of the second switch of the switch branch.

12. The switch short-circuited diagnosis method of claim 10, wherein the plurality of voltage intervals is cyclic six voltage intervals, including a first voltage interval, a second voltage interval, a third voltage interval, a fourth voltage interval, a fifth voltage interval, and a sixth voltage interval;

wherein in the first voltage interval, the voltage of the third phase wire is greater than the voltage of the second phase wire, and the voltage of the second phase wire is greater than the voltage of the first phase wire;

in the second voltage interval, the voltage of the third phase wire is greater than the voltage of the first phase wire, and the voltage of the first phase wire is greater than the voltage of the second phase wire;

in the third voltage interval, the voltage of the first phase wire is greater than the voltage of the third phase wire, and the voltage of the third phase wire is greater than the voltage of the second phase wire;

in the fourth voltage interval, the voltage of the first phase wire is greater than the voltage of the second phase wire, and the voltage of the second phase wire is greater than the voltage of the third phase wire;

in the fifth voltage interval, the voltage of the second phase wire is greater than the voltage of the first phase wire, and the voltage of the first phase wire is greater than the voltage of the third phase wire; and in the sixth voltage interval, the voltage of the second phase wire is greater than the voltage of the third phase wire, and the voltage of the third phase wire is greater than the voltage of the first phase wire.

13. The switch short-circuited diagnosis method of claim 12, wherein when the initial voltage interval is the first voltage interval, the step of "respectively performing the switch short-circuited diagnosis to the first bidirectional switch module from the initial voltage interval to the three consecutive voltage intervals" comprises:

in the first voltage interval, turning on the first switch of the first switch branch of the first bidirectional switch module, and determining whether the overcurrent occurs to the second switch of the second switch branch of the first bidirectional switch module and to the second switch of the third switch branch of the first bidirectional switch module;

in the second voltage interval, turning on the second switch of the third switch branch of the first bidirectional switch module, and determining whether the overcurrent occurs to the first switch of the first switch branch of the first bidirectional switch module and to the first switch of the second switch branch of the first bidirectional switch module;

in the third voltage interval, turning on the first switch of the second switch branch of the first bidirectional switch module, and determining whether the overcurrent occurs to the second switch of the first switch branch of the first bidirectional switch module and to the second switch of the third switch branch of the first bidirectional switch module; and in the fourth voltage interval, turning on the second switch of the first switch branch of the first bidirectional switch module, and determining whether the overcurrent occurs to the first switch of the second switch branch of the first bidirectional switch module and to the first switch of the third switch branch of the first bidirectional switch module.

14. The switch short-circuited diagnosis method of claim 12, wherein when the initial voltage interval is the first voltage interval, the step of "after the switch short-circuited diagnosis of the first bidirectional switch module is completed, respectively performing the switch short-circuited diagnosis of the second bidirectional switch module from the next voltage interval to the three consecutive voltage intervals" comprises:

in the fifth voltage interval, turning on the first switch of the third switch branch of the second bidirectional switch module, and determining whether the overcurrent occurs to the second switch of the first switch branch of the second bidirectional switch module and to the second switch of the second switch branch of the second bidirectional switch module;

in the sixth voltage interval, turning on the second switch of the second switch branch of the second bidirectional switch module, and determining whether the overcurrent occurs to the first switch of the first switch branch of the second bidirectional switch module and to the first switch of the third switch branch of the second bidirectional switch module;

in the first voltage interval, turning on the first switch of the first switch branch of the second bidirectional switch module, and determining whether the overcurrent occurs to the second switch of the second switch branch of the second bidirectional switch module and to the second switch of the third switch branch of the second bidirectional switch module; and in the second voltage interval, turning on the second switch of the third switch branch of the second bidirectional switch module, and determining whether the overcurrent occurs to the first switch of the first switch branch of the second bidirectional switch module and to the first switch of the second switch branch of the second bidirectional switch module.

15. The switch short-circuited diagnosis method of claim 12, wherein when the initial voltage interval is the first voltage interval, the step of "after the switch short-circuited diagnosis of the second bidirectional switch module is completed, respectively performing the switch short-circuited diagnosis of the third bidirectional switch module from the next voltage interval to the three consecutive voltage intervals" comprises:

in the third voltage interval, turning on the first switch of the second switch branch of the third bidirectional switch module, and determining whether the overcurrent occurs to the second switch of the first switch branch of the third bidirectional switch module and to the second switch of the third switch branch of the third bidirectional switch module;

in the fourth voltage interval, turning on the second switch of the first switch branch of the third bidirectional switch module, and determining whether the overcurrent occurs to the first switch of the second switch branch of the third bidirectional switch module and to the first switch of the third switch branch of the third bidirectional switch module;

in the fifth voltage interval, turning on the first switch of the third switch branch of the third bidirectional switch module, and determining whether the overcurrent occurs to the second switch of the first switch branch of the third bidirectional switch module and to the second switch of the second switch branch of the third bidirectional switch module; and in the sixth voltage interval, turning on the second switch of the second switch branch of the third bidirectional switch module, and determining whether the overcurrent occurs to the first switch of the first switch branch of the third bidirectional switch module and to the first switch of the third switch branch of the third bidirectional switch module.

* * * * *